(12) United States Patent
Andre et al.

(10) Patent No.: US 7,192,623 B2
(45) Date of Patent: Mar. 20, 2007

(54) THIN LAYER OF HAFNIUM OXIDE AND DEPOSIT PROCESS

(75) Inventors: Bernard Andre, Grenoble (FR); Jean Dijon, Champagnier (FR); Brigitte Rafin, Grenoble (FR)

(73) Assignee: Commissariat a l'Energie Atomique (FR)

( * ) Notice: Subject to any disclaimer, the term of this patent is extended or adjusted under 35 U.S.C. 154(b) by 168 days.

(21) Appl. No.: 10/607,912

(22) Filed: Jun. 27, 2003

(65) Prior Publication Data

US 2004/0091612 A1 May 13, 2004

Related U.S. Application Data

(62) Division of application No. 09/830,380, filed as application No. PCT/FR99/02797 on Nov. 15, 1999, now Pat. No. 7,037,595.

(30) Foreign Application Priority Data

Nov. 16, 1998 (FR) .................................. 98 14350

(51) Int. Cl.
*C23C 14/08* (2006.01)
*C23C 14/24* (2006.01)
(52) U.S. Cl. .............. 427/162; 427/255.31; 427/255.7; 427/419.3; 427/374.2; 427/398.1
(58) Field of Classification Search ................ 427/162, 427/164, 166, 255.23, 255.31, 255.7, 294, 427/419.3, 567, 593, 374.2, 398.1; 359/584, 359/588, 589, 838
See application file for complete search history.

(56) References Cited

U.S. PATENT DOCUMENTS

| | | | | |
|---|---|---|---|---|
| 5,339,326 A | * | 8/1994 | Tsujimura et al. | 372/49 |
| 5,399,435 A | * | 3/1995 | Ando et al. | 428/428 |
| 5,494,743 A | * | 2/1996 | Woodard et al. | 428/336 |
| 5,623,375 A | * | 4/1997 | Floch et al. | 359/871 |
| 5,670,248 A | | 9/1997 | Lazarov et al. | 428/304.4 |
| 5,691,044 A | * | 11/1997 | Oyama et al. | 313/461 |
| 6,077,569 A | * | 6/2000 | Knapp et al. | 427/534 |
| 6,319,730 B1 | * | 11/2001 | Ramdani et al. | 438/3 |

FOREIGN PATENT DOCUMENTS

EP    0 486 475 A2    3/1989
JP    60-064326 A  *  4/1985

OTHER PUBLICATIONS

"Influence of Microstructure on Laser Damage Threshold of IBS Coatings" by C.J. Stolz et al SPIE vol. 2714 XP-002111763, pp. 351-359.

(Continued)

*Primary Examiner*—Timothy Meeks
*Assistant Examiner*—Wesley D. Markham
(74) *Attorney, Agent, or Firm*—Hayes Soloway P.C.

(57) ABSTRACT

A thin layer of hafnium oxide or stacking of thin layers comprising hafnium oxide layers for producing surface treatments of optical components, or optical components, in which at least one layer of hafnium oxide is in amorphous form and has a density less than 8 gm/cm$^3$. The layer is formed by depositing on a substrate without energy input to the substrate.

15 Claims, 3 Drawing Sheets

OTHER PUBLICATIONS

"Thin Films for Optical Systems" edited by F.R. Flory Ecole Nationale Superleure de Physique de Marseille, Marseille, France pp. 521-549.

"Optical Coatings Deposited by Reactive Ion Plating" by A.J. Waldorf et al Applied Optics/Oct. 1, 1993/vol. 32, No. 28 pp. 5583-5593.

"Optical Coatings for High-Power Neodymium Lasers" by B. Brauns et al Sov. J. Quantum Electron 18 (10) Oct. 1988, c 1989 American Institute of Physics pp. 1286-1290.

"Investigation of Optical Damage Mechanisms in Hafnia and Silica Thin Films Using Pairs of Subnanosecond Laser Pulses with Variable Time Delay" by L.L. Chase, et al J. Appl. Phys. 71 (3) Feb. 1, 1992/American Institute of Physics pp. 1204-1208.

"Characterization of Defect Geometries in Multilayer Optical Coatings" by R.J. Tench et al J. Vac. Sci. Technol. A 12(5), Sep./Oct. 1994 1994 American Vacuum Society pp. 2808-2813.

"Reactive Evaporation of Low-Defect Density Hafnia" by R.Chow et al Applied Optics/ Oct. 1, 1993/vol. 32, No. 28/ pp. 5567-5574.

"Stress and Environmental Shift Characteristics of Hf02/Si)2 Multilayer Coatings" by J.F. Anzellotti et al Proceedings Reprint/ SPIE—The International Society for Optical Engineering Reprinted from 28th Annual Boulder Damage Symposiumproceedings "Laser-Induced Damage in Optical Materials: 1996" Oct. 7-9, 1996, Boulder, Colorado SPIE vol. 2966, pp. 258-264.

"Study of the Structure and Properties of Thick Vacuum Condensates of Nickel, Titanium, Tungsten, Alumnium Oxide and Zirconium Dioxide" by B.A. Movchan et al F metal.metalloved., No. 4, 653-660, 1969 pp. 83-90.

"Nano Absorbing Centers: A Key Point in Laser Damage of Thin Films" by J. Dijon et al SPIE vol. 2966, pp. 315-325.

* cited by examiner

THIN LAYER OF HAFNIUM OXIDE AND DEPOSIT PROCESS

CROSS REFERENCE TO RELATED APPLICATION

This application is a divisional of U.S. application Ser. No. 09/830,380, filed Apr. 25, 2001, now U.S. Pat. No. 7,037,595, which is a 371 of PCT/FR99/02797, filed on Nov. 15, 1999.

FIELD OF THE INVENTION

The invention relates to the field of thin layers of hafnium oxide or stacks of thin layers comprising at least one layer of hafnium oxide. It also concerns a process for producing thin layers of hafnium oxide. These thin layers are layers appearing in multilayer structures incorporating, apart from hafnium oxide layers, layers of other compositions.

PRIOR ART

The deposit of thin layers of hafnium oxide, just like many other deposits, is carried out in known fashion by evaporation under vacuum. The basic principle is as follows:

In a vacuum chamber, an electron gun heats a target constituted of the material to be deposited. The material is then vaporised and deposited on a substrate, which has been placed close by. In the case of an oxide deposit, one can also carry out the same operation starting from the product to be oxidised, for example a metal, the vacuum chamber containing oxygen under very low pressure. The latter procedure is known under the name "reactive evaporation under oxygen".

In the case of hafnium oxide, the two techniques are used but for reasons which will be set out below, they are always associated with energy means such as direct heating of the substrate, ion bombardment of the layer during growth, or furthermore acceleration of the ions of the material to be deposited by means of an electric field, in such a way that they provide energy to the substrate.

The deposit processes are described in a more detailed way, for example in the manual by J. D. RANCOURT "Optical thin film user handbook, SPIE Press, 1996" (C1).

The production of layers of hafnium oxide or hafnia ($HfO_2$) is used mainly in multilayer coatings of optical components submitted to high laser fluxes. The function of the hafnia layers can be to ensure protection of the components to which they are added.

The component incorporating such layers of hafnia can in itself ensure protection against the laser flux and the optical function of the component. The multilayer composition can also be deposited as a protective coating on a pre-existing optical component to attenuate the laser flux undergone by this optical component. The hafnia layers ensure protection in the wavelength ranges extending from the ultraviolet to the infrared for any type of laser, impulse or continuous.

The multilayer components incorporating the hafnia layers ensure the optical functions for example of mirror, spectral filter or anti-reflection.

The production of these special optical functions requires the production of surface treatments. It concerns, by suitable stacking of materials with different refraction indices, creation of an interferential system, which creates the desired optical function.

In order to do this, two or more materials are used, deposited alternately. In general, two materials, one with a high index and the other with a low index, suffice for the majority of applications.

Many materials can be used to play this role. For example, the following can be cited:
silicon dioxide or silica ($SiO_2$)
alumina ($Al_2O_3$)
titanium dioxide ($TiO_2$)
Yttrium fluoride $YF_3$)

In the special case of optics submitted to high laser fluxes, the laser damage threshold (LDT) of stacks is defined as the value of the fluence (or energy received per surface unit) above which appears a permanent modification of surface treatment. Indications about the modes for producing layers with high damage thresholds can be found in a book by M. R. Kozlowski "Thin film for Optical Systems" published by F. R. Flory in 1995, (C2). Chapter 17 of this book page 521 and following, provide the present trends in the choice of the material constituting the layers, the methods for measuring damage and deposit methods. In this chapter, especially in paragraph 3–5 pages 536–537, it is especially indicated that the deposit techniques with energy means, as for example, with ion bombardment, have become very widely used because of the improved possibilities of controlling the thickness and the mechanical stability of the layer. These processes lead to layers with limited defects.

The damage to optical components is the factor limiting the maximum working laser fluences. This motivates research into improving laser damage thresholds for surface treatments.

Within this framework, numerous families of materials were studied, for example, fluoride, chalcogenide and oxide materials. The latter have been studied the most within the framework of surface treatments presenting high laser damage thresholds.

For applications with high laser flux in the near infrared, the $HfO_2/SiO_2$ couple is usually used, given the high laser damage thresholds of the components obtained. Examples of results obtained with this couple are described in diverse applications. These publications in general indicate in which manner the layers were deposited. Examples of such publications are given below, for information and for better understanding of what is to follow. An article by Allan J. WARLDORF et Al. published the Jan. 10, 1993 in the revue "Applied Optics" Vol. 32 No. 28, pages 5583–5593 (C3) describes the methods and results obtained concerning the laser damage threshold with this couple. This article explains (in particular page 5583, second column) that the evaporation processes by heating the product to be evaporated by heating resistance or by electron beam give rapid but unsatisfactory results, in particular from the point of view of damage thresholds. It indicates that the porosity of the films can be reduced by raising the temperature of the substrate, or by acceleration of the ions to be deposited.

It is also indicated that the results obtained with the methods of ion acceleration (ion plating) have encouraged filter manufacturers to use this method which therefore has tended to be generalised (p. 5584 top of column 2).

Other articles, for example BRAUN et al. entitled "Optical coating for high-power neodymium lasers" published in the review SOV. J. Quantum Electron 18 (10)—1988—page 1286–1290 (C4) or again that of L. L. Chase et al., "Investigation of optical damage in hafnia and silica thin films using pairs of sub-nanosecond laser pulses with variable time delay, J. Applied Physics, 71(3)(1992), pages 1204–1208" (C5) give damage results obtained with refractory oxide layers and in particular with hafnium oxides.

In the two articles quoted above, (C4–C5), the coatings were obtained by electron beam evaporation. In the second article (C5) it is indicated (page 1204, bottom of column 2) that the substrates were maintained at a temperature of 200° C. during deposit.

In the great majority of published works, the coatings are produced by evaporation under vacuum from a hafnium oxide precursor.

Among the references already given. above, on this subject, one can mention documents C2, C4, C5 and also the article by R. J. Tench et al., "Characterization of defects geometries in multilayer optical coatings, J. Vac. Sci. Technol. A 12(5) (1994) pp 2808" (C6)

This elaboration technique, directly from the oxide, has the inconvenience of generating many defects in the coatings due to projections issuing from the oxide load during evaporation.

These defects buried in the stack are identified as precursors of optical damage under laser flux. Relative to this subject, one can consult the article of R. Chow et al., "Reactive evaporation of low-defect density hafnia, Applied Optics. Vol. 32 No. 28 (1993) pp 5567" (C7).

There are few publications openly available relative to the production of components from reactive evaporation of metallic hafnium under oxygen.

Apart from document C7, already mentioned above, it is however possible to cite the article by J. F. Anzellotti et al., "Stress and environmental shift characteristics of $HfO_2/SiO_2$ multilayer coating. Proceedings of the 28th annual Boulder Damage Symposium, SPIE Vol. 2966 (1996)" (C8).

In document C7, the results obtained by the evaporation techniques of hafnium metal and hafnia are compared.

Although they present attractive results concerning the reduction of the density and defects of nodular type, the authors do not demonstrate an improvement of laser damage thresholds for coatings produced by reactive evaporation of metal under oxygen. It can be thought that the presence of nodules in the coatings does not constitute a laser damage factor until the ultimate performance of the materials has been reached.

Taking into account the state of the art, the inventors considered that it was possible to obtain good results concerning laser damage resistance, for the production of layers ensuring optical functions for example of the mirror, spectral filter or antireflection type, from the reactive evaporation of metallic hafnium under oxygen, but on condition of mastering the growth conditions of the layers in particular the formation of aggregates and crystallinity.

It is known, for example from the article by B. A. Movchan et al. Fiz. Met. Mettaloved, 28 (1969) pp 653 (C9) that the structure and properties of condensates of metals or oxides depend closely on the temperature of the substrate on which the condensation takes place.

Therefore, the inventors tried to understand better the crystalline growth and the formation of metal aggregates and thus the ways to avoid them.

Non-energy processes with evaporation base produce coatings with high porosity.

In fact, the energy of evaporated species is relatively low: it is a function of the evaporation temperature of the material but typically of the order of several tenths of electron volts (eV). This leads to a very low mobility of species which condense on the surface of the substrate. In the time interval corresponding to the deposit of two successive atom monolayers, the atom displacements are not sufficient for inducing the compaction of layers and these vacancies are "buried". In this way, a microstructure of porous layers is induced, characteristic of deposits obtained by evaporation. The consequence of this is the production of layers more difficult to control, for the following reasons:

- appearance of mechanical tension stresses in the layers which do not favour the stability of the stacks unless specific compensation mechanisms are put into operation;
- evolution with time of the optical response of the component (progressive filling of porosities by water, inducing slipping of the average refraction index);
- process drift, the share of the thermal radiation of the evaporation loads being no longer negligible on a non-heated substrate. This means that the temperature of the substrate on which the deposit is made increases, and consequently the mobility of the species which condense on the substrate.

To minimise or annul the phenomena mentioned above, the great majority of processes implement means making it possible to densify the coatings. In order to do this, those skilled in the art possess techniques allowing an energy input on coatings during growth: the heating of substrates and ion bombardment of layers during growth.

As seen above, these techniques, providing the substrate with an input of energy, are very widely used in evaporation processes for thin layers.

The inventors have shown that these techniques degraded the performances of thin layers in terms of laser damage threshold at 1.06 μm.

This idea is based on studies on the damage of thin layers by lasers. Results of these studies have been published by J. Dijon et al., Nano absorbing center: a key point in laser damage of thin films. Proc. of 28th annual Boulder Damage Symposium, SPIE Vol. 2996 (1996) (C10). It is to be noted that one of the authors of this publication is also one of the inventors. The results of these studies are that the presence of metallic impurities under aggregate form in the coatings provokes, via the creation of a relay mechanism of heating of aggregates and radiation in the far ultraviolet, a local transformation of the layers rendering them absorbent to laser radiation at 1.06 μm, then the coupling of the laser on the material and destruction of the coating.

It is difficult to avoid the presence of metallic impurities within surface treatments whether they are impurities of external origin (material from the evaporation crucible, impurities from the evaporation load, constitutive elements of the evaporation chamber in the case of utilisation of an ion source) or incompletely oxidised hafnium atoms.

When heating, or which comes to the same from the point of view of energy input to the substrate, when bombarding the layer with ions during growth, crystallisation of the deposit is encouraged.

It is known that grain boundaries present in a crystallised material constitute privileged pathways for diffusion of impurities. An amorphous structure can "freeze" the diffusion of these impurities.

According to observations made by the inventors, the phenomenon of crystallisation of hafnia is necessarily induced by the energy supplied to the substrate by heating or by ion bombardment. This crystallisation is revealed by peaks of X-ray diffraction. The crystallisation characteristic of the energy input is also revealed by transmission electron microscopy. With this method the crystalline planes diffract the electrons in precise directions giving well defined rings from which it is possible to determine the crystalline structure of the material, for example a monoclinic structure for a deposit carried out on a substrate heated to 200° C.

BRIEF DESCRIPTION OF THE INVENTION

Taking into account the state of the art which has just been described, the inventors thought that any energy input is unfavourable for withstanding laser flux since it will encourage the stabilisation of these impurities by the formation of aggregates.

The basic idea of the invention, which goes contrary to the usual concepts of those skilled in the art, consists of working on a non-energy process, that is to say without either ionic assistance or heating of the substrates.

The materials deposited are thus amorphous, that is to say non-crystalline. In addition, when working with an energy input, one creates a compaction of the layer deposited. On the contrary, the material deposited without energy input has a lower density. In the inventors' documentation no data was found relating to the density of the hafnia layers deposited by known processes. The lowest densities known to the inventors are 8.5 gm/cm$^3$. The densities measured on the hafnia layers according to the invention range between 6.4 and 8.1 gm/cm$^3$. These densities can be measured by X-ray reflectometry. As pointed out above, crystallisation only intervenes if the substrates are heated or, which comes to the same thing from the point of view of energy input, if the layer is bombarded with ions during growth. The absence of crystallisation, according to the inventors, can also explain the reduction of the formation of aggregates because, as already mentioned above, grain boundaries present in a crystallised material constitute privileged pathways for diffusion of impurities. An amorphous structure can "freeze" the diffusion of these impurities.

To summarise, the invention relates to a thin layer of hafnium oxide characterised in that the hafnium oxide is in amorphous form with a density lower than 8 gm/cm$^3$.

Contrary to the layers of hafnium oxides of prior art, an amorphous layer of hafnium oxide does not show any X-ray diffraction peak. Observation by transmission electron microscopy shows diffuse rings characteristic of an amorphous structure. The invention also relates to a stack of thin layers characterised in that it comprises at least one layer of amorphous hafnium oxide of density lower than 8 gm/cm$^3$ or, furthermore, to an optical component with a surface treatment characterised in that said surface treatment comprises at least one layer of amorphous hafnium oxide of density lower than 8 gm/cm$^3$.

In general, said layer of amorphous hafnium oxide of density lower than 8 gm/cm$^3$ is part of a stack of layers comprising at least one layer with a refraction index different from that of hafnium oxide.

Finally, the invention relates to a process for depositing under vacuum on a substrate at least one layer of hafnium oxide by reactive evaporation under oxygen of metallic hafnium, said process characterised in that the deposit is carried out without any energy input to the substrate, whether or not this input is before the deposit or during the deposit.

When one says that there is no energy input, this means that on the one hand the substrate is not heated or pre-heated, and on the other hand that no energy process is used such as ion bombardment of the layer during growth, or ion acceleration before deposit (ion plating). The deposit is a "natural" deposit through the simple effect of condensation of the material to be deposited on the substrate. This deposit is then amorphous, that is to say there is an absence of crystallinity.

As indicated above, the main advantage provided by layers of amorphous hafnia according to the invention is the very high resistance to laser flux.

The hafnia mono-layer according to the invention, deposited on silica, was able to withstand a laser flux higher than 15 Joules/cm$^2$ at a wavelength of 1.06 μm with impulses of 3 nsec with a recurrence frequency of 10 Hz until obtaining 15 Joules/cm$^2$. The best prior art known to the inventors is situated, under the same conditions, in a range from 3 to 5 Joules/cm$^2$.

Furthermore, the cold process according to the invention allows a very substantial gain in time for the deposit chamber cycle.

In fact, heating the substrates can immobilise the deposit equipment for a whole day when treating the most voluminous pieces, for example mirrors for the Megajoule laser beam carrier. This mirror will be described below.

With the cold process according to the invention, the production of this type of mirror requires a time cycle of 5 hours (not including putting the chamber under vacuum). It is therefore possible to carry out one deposit cycle per day, even if it were shown that a cooling of components between each hafnia deposit significantly improves the performance of the components.

Finally, with the process according to the invention, it is not necessary to make deposits on substrates with high thermal stability.

In the production carried out so far, it has not been necessary to cool the substrate actively, nor to control its temperature in a precise fashion.

For deposits of several mono-layers, the time required is short enough not to provoke significant temperature rise; for thicker deposits, two stages were applied (or more if necessary) interrupted by free cooling time (for example, overnight). It is also possible to envisage cooling time after the deposit of each layer of HfO$_2$. These cooling periods typically last for a time equivalent to one or several deposit times of the preceding layer.

It is also possible, in order to reduce the time of utilisation of the chamber for a special mono-layer or multilayer production, to cool the substrate actively during growth of the deposit or during an interruption period of the deposit.

BRIEF DESCRIPTION OF THE DRAWINGS

Examples of production of stacks of thin layers among which amorphous hafnia layers according to the invention will now be described with reference to the attached drawings in which:

FIG. 2 between layers of hafnium oxide comprising oxide crystals resulting from heating of the substrate and an amorphous layer according to the invention, FIG. 3 between a layer of hafnium oxide comprising crystals of hafnium oxide resulting from ion bombardment of the substrate and an amorphous layer according to the invention.

DESCRIPTION OF EXAMPLES OF PRODUCTION OF STACKS OF LAYERS COMPRISING LAYERS ACCORDING TO THE INVENTION

Figure 1:
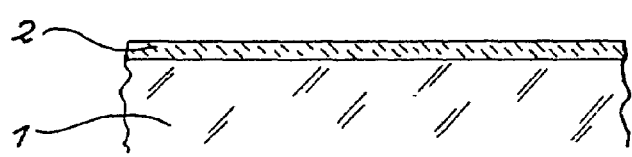
FIG. 1 shows a cross-section of a substrate carrying a layer of amorphous hafnium oxide according to the invention.

FIG. 1 shows a layer of amorphous hafnium oxide 2, according to the invention, deposited on a substrate 1. It can be checked that the hafnium oxide is amorphous, for example, by observation of the X-ray diffraction plot.

Figure 2:
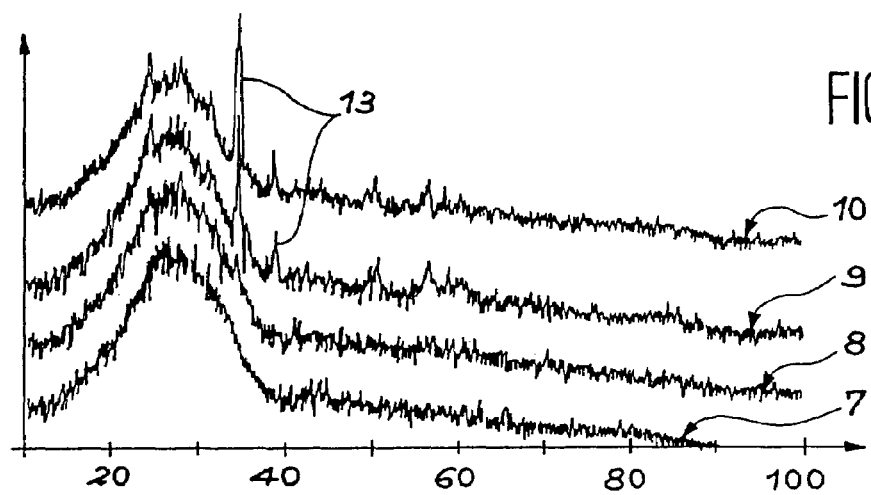
FIGS. 2 and 3 show comparisons between plots of X-ray diffraction.
Figure 3:
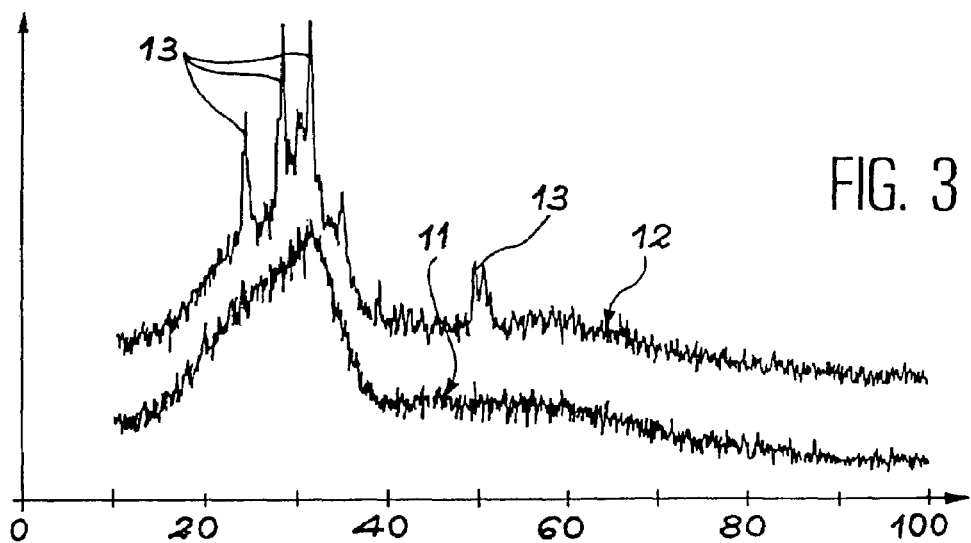

Such plots are shown in FIGS. 2 and 3.

FIG. 2 shows curves 7, 8, 9, 10. The curves represent in arbitrary units, the intensity of X-rays diffracted depending upon the value of the angle of diffraction.

Curve 7 shows the diffraction spectrum of a layer of hafnia produced cold (without heating of the deposit substrate).

Curves 8, 9 and 10 show diffraction spectra of a hafnia layer produced with a deposit substrate of 100°, 150°and 200° C. respectively.

FIG. 3 shows two curves 11 and 12. These curves show the diffraction spectra of hafnia layers produced either without ion bombardment of the layer during growth (curve 11), or with ion bombardment (curve 12).

Curves 7 and 11 do not reveal any diffraction peaks 13: the layers of hafnia are thus amorphous.

On the other hand, curves 8, 9, 10 and 12 reveal diffraction peaks 13 characteristic of crystalline materials.

The following examples of embodiments are produced by stacks of layers of $HfO_2/SiO_2$ for the reasons given above.

The layers of amorphous hafnium oxide are deposited cold according to the process of the invention, as are the layers of silicon oxide, deposited without deliberate heating nor ion bombardment of the substrates.

A first embodiment example relates to the production of a mirror 4 at 1064 nm. The mirror 4 must ensure a reflecting function at 1064 nm under an angle of incidence of 45°. This mirror 4 is produced by a stack of formula 12 (HB) H2B where H represents a mono-layer of thickness 156 nm of $HfO_2$ and B a mono-layer of 213 nm of $SiO_2$.

Figure 4:
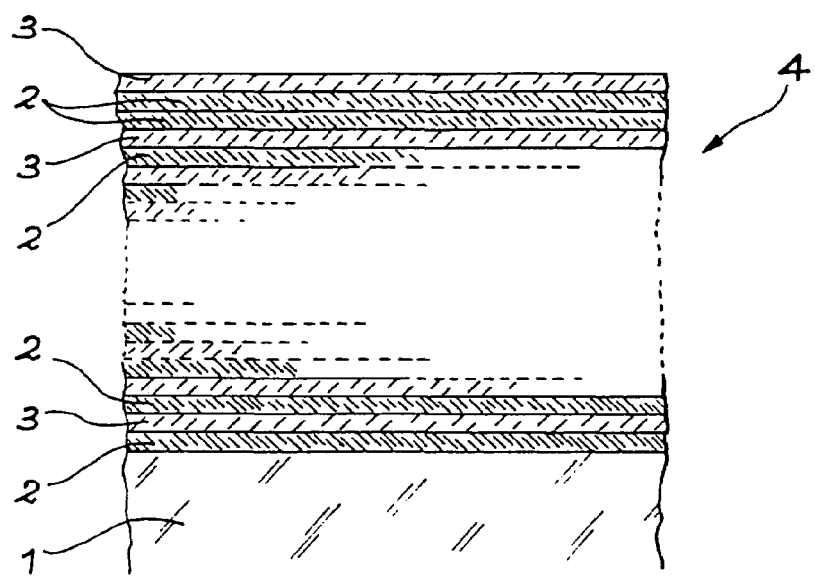
FIG. 4 shows a cross-section of a substrate carrying a stack composed of layers of amorphous hafnium oxide according to the invention and layers of silicon oxide, the stack ensuring a mirror function.

A cross-section of this optical mirror 4 intended to represent the stacking of the layers is shown in FIG. 4. On a substrate 1, the mirror according to the invention comprises first of all a stack of twelve layers H of amorphous hafnium oxide 2, each alternating with a layer B of silicon oxide 3. It then comprises two layers H of amorphous hafnium oxide 2 and finally a layer B of silicon oxide 3.

Figure 5:
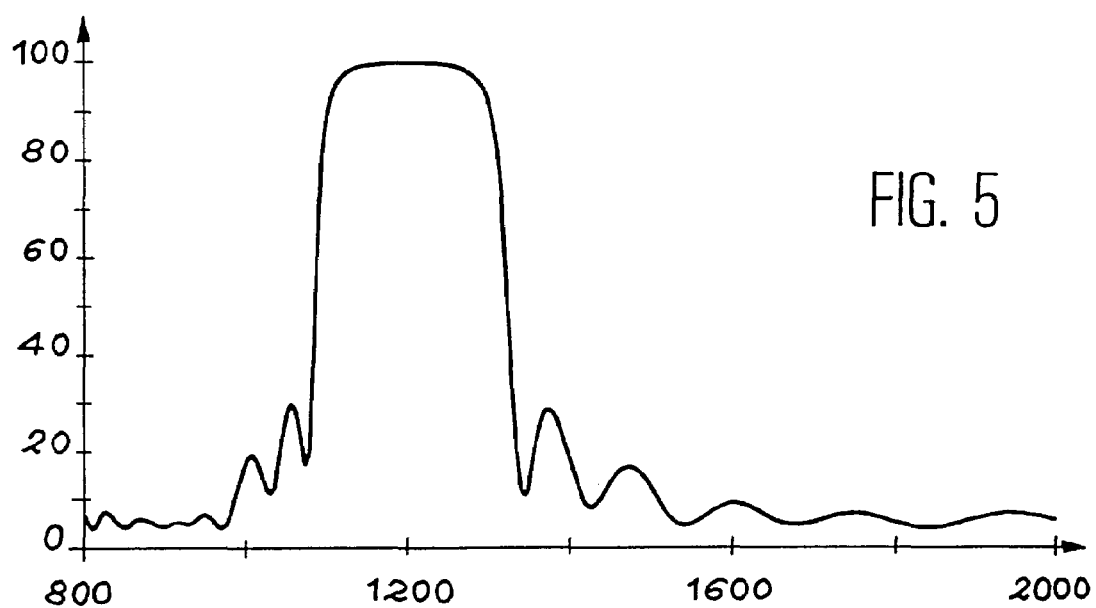
FIG. 5 is a curve representing the reflection of a mirror component of FIG. 4 in function of wavelength.

In order to produce such thick stacks, the radiation of hafnium raised to more than 2000° C. creates a progressive rise in the temperature by direct radiation on the substrates. If no special precautions are taken, it is estimated from thermocouple measurements that the temperature approaches 100° C. at the end of evaporation. It is possible to reduce this rise in temperature by interrupting the process by periods of cooling. In this embodiment the reflecting layer was obtained in two stages with a phase of natural cooling half-way through the stacking. FIG. 5 shows the reflection of the component in function of wavelength. Reflection reaches 99.5% at 1200 nm. Measurement at an angle of incidence of 45° gives a reflectivity higher than 99% at 1064 nm. A damage test was carried out with increasing fluence according to the "R On 1" method described on page 523 of document C2. According to this method, each test zone is illuminated with increasing series of several hundreds of impulses, here of 3 nanoseconds each, with a recurrence frequency of 10 Hertz, of increasing fluence. The average damage thresholds measured are of the order of 50 Joules/cm$^2$, that is to say a value much higher than any mentioned in present publications. Thus Waldorf et al. report in document C3 that they obtained values of threshold laser damage at 1.06 µm lower than 2 Joules/cm$^2$ from hafnium evaporation, but with ion bombardment, (species energy $Ar^+$ and $O_2^+$ which bombard the substrate during growth of the order of 40 eV in this study) thus energy input to the substrate which results in crystallisation of the hafnium oxide contrary to the process of the invention which itself is without energy input and results in layers of amorphous hafnium oxide.

The inventors consider that these good results are due to the absence of metallic aggregates and/or the amorphous form of the hafnia layers according to the invention whereas on the contrary, according to prior art, the energy input resulted in crystallisation of the material.

The second example is relative to a surface anti-reflection treatment in the wavelength range of 550 to 670 nm. This treatment can, for example, be used as treatment for an optical component in a SILVA laser chain used for the isotopic separation by laser of uranium in vapour phase. A stack of six layers of $HfO_2/SiO_2$ of total thickness 630 nm was deposited on each of the faces of a substrate, the layers of amorphous hafnia being deposited by the process according to the invention.

Figure 6:
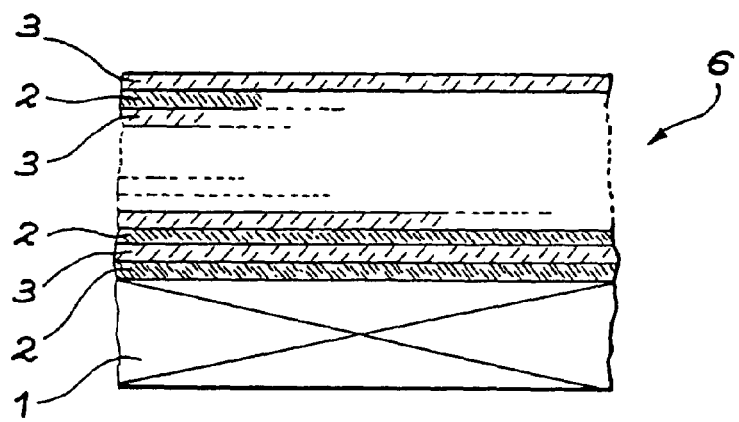
FIG. 6 is a partial cross-section of an optical component comprising a stack of alternate layers of amorphous hafnia and silicon oxide.

In FIG. 6, the optical component 6 is shown, with the aim of simplification, with a single example of the two-layer composition comprising a layer of amorphous hafnia 2 alternating with a layer of silicon oxide 3.

Figure 7:
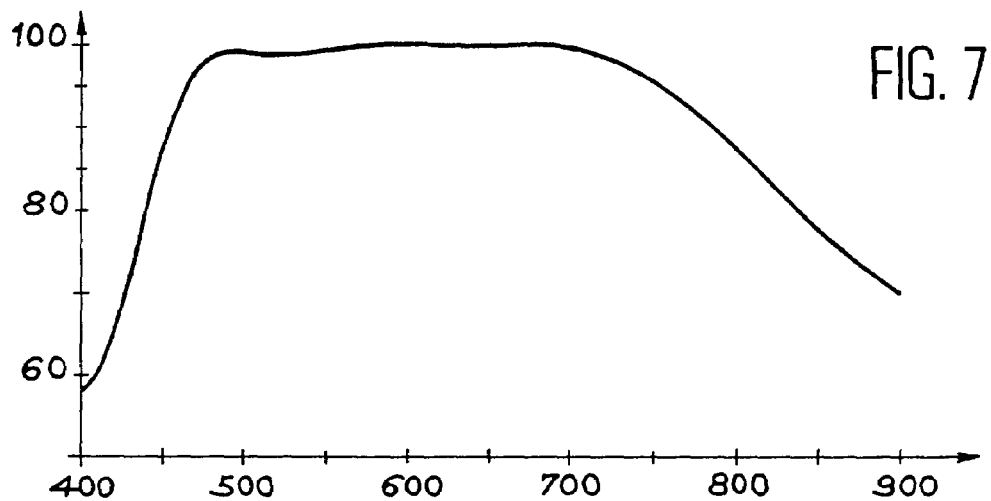
FIG. 7 is a curve representing the optical performances of an anti-reflection component in terms of percentage of transmission of light in the working spectrum range.

The curve in FIG. 7 shows the optical performance of component 6 in terms of percentage of light transmission in the working spectral range expressed in nm. It can be seen that the percentage is very close to 100% within the entire working range. The behaviour of this component under laser flux is shown to be excellent within the utilisation wavelength range.

Thus, the component resisted an irradiance higher than 80 kW/cm$^2$ by a laser emitting at a wavelength of 578 nanometers. The frequency of irradiance pulses, each of 3 ns was 5.6 KHz and the exposure time was about five minutes.

Figure 8:
FIG. 8 is a curve representing the values of transmission of a silica substrate in the 800–2600 nm range treated with a stack of 10 layers of $HfO_2$ and $SiO_2$ of total thickness 2300 nm.

The third example relates to the embodiment of a 3-strip antireflection treatment. The component described in this example is part of an optical parametric oscillator device (OPO). This treatment is deposited on a crystal of potassium and titanyl phosphate ($KTiPO_4$) generally referred to as KTP, which is submitted to laser irradiation at 1064 nm. The properties of the crystal are such that this irradiation induces an emission of photons at 1572 and 3292 nm. The aim of the treatment is to eliminate the parasitic reflections at these wavelengths in order to improve the OPO performances. FIG. 8 shows the transmission values of a silica substrate within the range 800–2600 nm treated with a stack of 10 layers of $HfO_2$ and $SiO_2$ of total thickness 2300 nm. The representation of this treatment on the KTP crystal would not aid the understanding of the invention, and therefore it has not been shown. Measurements of residual reflectivity on the KTP crystal are, at the working wavelengths:

R=0.1% at 1064 nm
R=0.01% at 1572 nm
R<7% at 3292 nm

The laser damage threshold at 1064 nm is 23 J. cm$^{-2}$, which is remarkable for a low reflection treatment at this wavelength; in fact the quasi-totality of the flux crosses the component and stresses the stack assembly.

EXAMPLE OF AN EMBODIMENT OF THE PROCESS ACCORDING TO THE INVENTION

Information relating to the process for producing hafnia layers according to the invention has already been given above.

For the three examples of embodiments described above, the production conditions were in compliance with the following table:

|  | HfO$_2$ layer | SiO$_2$ layer |
|---|---|---|
| Crucible | Without crucible or in graphite | Without crucible |
| Departure material | Hf metal turnings (1–3 mm) | SiO$_2$ granules |
| Electron gun | 10 kV ≅ 400 mA | 10 kV ≅ 200 mA |
| O$_2$ pressure | 4.10$^{-4}$ mbar | without O$_2$ addn. |
| Deposit rate | 0.25 nm/sec | 0.45 nm/sec |
| Deposit temp. | ambient | ambient |

There is a significant difference from prior art: as can be seen, the temperature of deposit substrate is equal to the ambient temperature, that is about 20° C. and not 200° C. as in prior art.

The invention claimed is:

1. A process for forming a layer of hafnium oxide on a substrate which comprises forming a vapor of hafnium by reactive evaporation of metallic hafnium, and condensing without ion bombardment the vapor on the substrate under oxygen, said process comprising a plurality of deposit periods interrupted by cooling periods, each cooling period lasting for a time equivalent to one or several times the preceding deposit period, whereby an amorphous layer of hafnium oxide is formed on said substrate.

2. The process according to claim 1, wherein a stack of layers is formed.

3. The process according to claim 2, wherein the stack also includes at least one layer formed of a material having a refractive index different from that of hafnium oxide.

4. Process as claimed in claim 1, wherein a stack comprising at least one layer of another material is formed on a surface of the amorphous layer of hafnium oxide.

5. Process as claimed in claim 4, wherein said another material comprises silicon oxide.

6. Process as claimed in claim 4, wherein the stack comprises alternate layers of amorphous hafnium oxide having a density less than 8 gm/cm$^3$ and another material.

7. The process as claimed in claim 6, wherein said another material comprises silicon oxide.

8. A process for forming an optical component which comprises vacuum depositing on a substrate at least one layer of amorphous hafnium oxide by the process of claim 1.

9. The process according to claim 8, wherein the at least one layer of hafnium oxide comprises amorphous hafnium oxide having a density less than 8 gm/cm$^3$.

10. The process according to claim 9, wherein the optical component comprises a mirror.

11. The process according to claim 1, wherein the substrate is at about 20° C.

12. The process according to claim 1, wherein the process is conducted in a vacuum chamber.

13. The process according to claim 1, wherein the substrate is cooled during the process.

14. The process according to claim 1, wherein at least one layer of amorphous hafnium oxide having a density between 6.4 and 8.1 gm/cm$^3$ is formed.

15. The process according to claim 1, wherein at least one layer of hafnium oxide having a density lower than 8 gm/cm$^3$ is formed.

* * * * *